US012767472B2

(12) United States Patent
Suzuki et al.

(10) Patent No.: US 12,767,472 B2
(45) Date of Patent: Oct. 20, 2026

(54) AUTOMATIC TAPE PROCESSING DEVICE AND REEL LOADING DEVICE

(71) Applicant: FUJI CORPORATION, Chiryu (JP)

(72) Inventors: Daiki Suzuki, Toyokawa (JP); Masataka Iwasaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 184 days.

(21) Appl. No.: 18/724,231

(22) PCT Filed: Jan. 31, 2022

(86) PCT No.: PCT/JP2022/003576
§ 371 (c)(1),
(2) Date: Jun. 26, 2024

(87) PCT Pub. No.: WO2023/145061
PCT Pub. Date: Aug. 3, 2023

(65) Prior Publication Data

US 2025/0066152 A1 Feb. 27, 2025

(51) Int. Cl.
*B65H 19/10* (2006.01)
*H05K 13/00* (2006.01)

(52) U.S. Cl.
CPC ......... *B65H 19/10* (2013.01); *H05K 13/0084* (2013.01); *B65H 2301/5151* (2013.01); *B65H 2553/41* (2013.01)

(58) Field of Classification Search
CPC ............. H05K 13/021; H05K 13/0417; H05K 13/0084; B65H 19/10
See application file for complete search history.

(56) References Cited

U.S. PATENT DOCUMENTS 11,388,850 B2 * 7/2022 Oyama .............. H05K 13/0419
11,511,959 B2 * 11/2022 Oyama .............. H05K 13/0419
2013/0326867 A1 * 12/2013 Uesugi ............... H05K 13/0419 221/9
2016/0255753 A1 * 9/2016 Inoue ................. H05K 13/0419 226/76
2018/0376630 A1 * 12/2018 Otsuki ............... H05K 13/0419
2021/0002081 A1 * 1/2021 Sakurayama .......... G01B 11/14

FOREIGN PATENT DOCUMENTS

WO WO 2014/097473 A1 6/2014
WO WO 2016/203628 A1 12/2016
WO WO 2020/105112 A1 5/2020

OTHER PUBLICATIONS

International Search Report mailed on Apr. 5, 2022 in PCT/JP2022/003576 filed on Jan. 31, 2022 (2 pages).

* cited by examiner

*Primary Examiner* — Sang K Kim
(74) *Attorney, Agent, or Firm* — Oblon, McClelland, Maier & Neustadt, L.L.P.

(57) ABSTRACT

An automatic tape processing device includes a feeding device in which a cover tape is adhered to an upper surface side of a base tape in which cavities configured to accommodate a component are provided at a constant pitch, the feeding device being configured to convey a carrier tape to be loaded into a tape feeder, a cutting device configured to cut each of the base tape and the cover tape at a cutting portion, and a control device configured to determine the cutting portion of each of the base tape and the cover tape according to a type of the tape feeder and control operations of the feeding device and the cutting device so that the base tape and the cover tape are cut at the determined cutting portion.

11 Claims, 19 Drawing Sheets

AUTOMATIC TAPE PROCESSING DEVICE AND REEL LOADING DEVICE

TECHNICAL FIELD

The present description relates to an automatic tape processing device and a reel loading device.

BACKGROUND ART

Conventionally, for example, an automatic tape processing device and an automatic tape setting device disclosed in the following Patent Literature 1 are known. A conventional automatic tape processing device subsequently positions cutting portions of a base tape and a cover tape forming a carrier tape at cutting positions by controlling a feeding device and a peeling device based on a detection signal from a detection device that detects the presence or absence of a component. A conventional automatic tape processing device is configured to automatically perform processing of causing a cutting device to subsequently cut cutting portions of a base tape and a cover tape.

PATENT LITERATURE

Patent Literature 1: WO 2014/097473

BRIEF SUMMARY

Technical Problem

Here, a tape reel around which a carrier tape is wound may be loaded into a tape feeder of a different type. In this case, a front end of the carrier tape needs to be processed according to the type of the loaded tape feeder. However, in a conventional automatic tape processing device, when the type of the tape feeder is matched, it is necessary for a worker to perform processing including instruction input and manual work so that a state of the front end corresponding to the type of the tape feeder is achieved. In this case, the manual work performed by the worker increases, and as a result, there is a possibility that work errors such as a state in which the front end of the carrier tape is not adapted to the loaded tape feeder and the occurrence of loss due to the falling off of the component accommodated in the carrier tape occur. Therefore, in the conventional automatic tape processing device, there is room for improvement in the progress of automation.

An object of the present description is to provide an automatic tape processing device and a reel loading device that perform processing on a carrier tape according to a type of a tape feeder to be loaded.

Solution to Problem

The present description discloses an automatic tape processing device including: a feeding device in which a cover tape is adhered to an upper surface side of a base tape in which cavities configured to accommodate a component are provided at a constant pitch, the feeding device being configured to convey a carrier tape to be loaded into a tape feeder, a cutting device configured to cut each of the base tape and the cover tape at a cutting portion, and a control device configured to determine the cutting portion of each of the base tape and the cover tape according to a type of the tape feeder and control operations of the feeding device and the cutting device so that the base tape and the cover tape are cut at each determined cutting portion.

With the automatic tape processing device, the control device can automatically determine the cutting portions of the base tape and the cover tape according to the type of the tape feeder into which the carrier tape is loaded. Then, the control device can operate the feeding device and the cutting device such that the base tape and the cover tape are cut at the determined cutting portions. Accordingly, it is possible to perform automation that eliminates instruction input and manual work by a worker when processing the front end of the carrier tape, and it is possible to reduce the burden on the worker and reduce work errors.

DESCRIPTION OF EMBODIMENTS

Hereinafter, an automatic tape processing device and a reel loading device will be described with reference to the drawings. In the present embodiment, a production line configured to convey a tape reel around which a carrier tape processed by an automatic tape processing device is wound to a reel loading device and load the tape reel into a tape feeder by the reel loading device will be described as an example.

1. Overview of Production Line S

Figure 1:
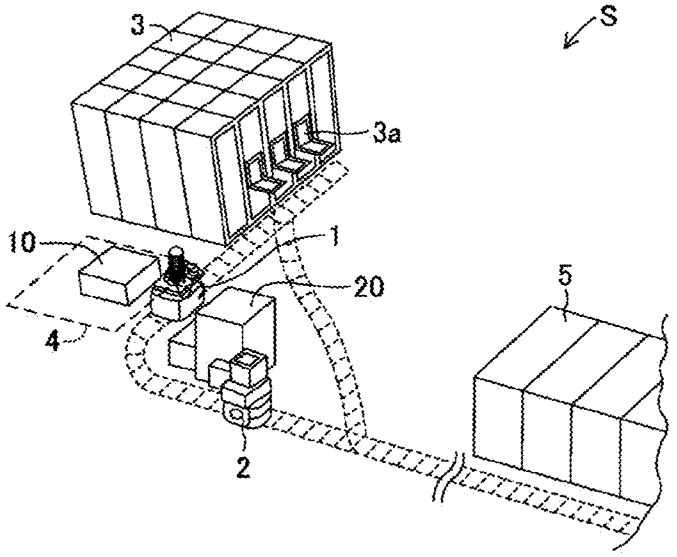
FIG. 1 is a perspective view illustrating a production line including an automatic tape processing device and a reel loading device.

As illustrated in FIG. 1, production line S includes automatic tape processing device 10 and reel loading device 20. Production line S includes reel carrier 1 and feeder carrier 2. Here, reel carrier 1 and feeder carrier 2 use, for example, an automatic guided vehicle (AGV) as a drive section thereof.

Reel carrier 1 conveys tape reel R (hereinafter, simply referred to as "reel R") from entrance/exit port 3*a* of warehouse 3 to automatic tape processing device 10 disposed in offline setup area 4, and conveys reel R from automatic tape processing device 10 to reel loading device 20. Feeder carrier 2 conveys tape feeder F (hereinafter, simply referred to as "feeder F") from entrance/exit port 3*a* of warehouse 3 to reel loading device 20. In production line S, feeder carrier 2 conveys feeder F loaded with reel R by reel loading device 20 to component mounter 5. In the present embodiment, a case where automatic tape processing device 10 and reel loading device 20 are independently disposed is exemplified, but automatic tape processing device 10 and reel loading device 20 may be integrally provided. In this case, after the process by automatic tape processing device 10, a loading process by reel loading device 20 is executed.

Figure 2:
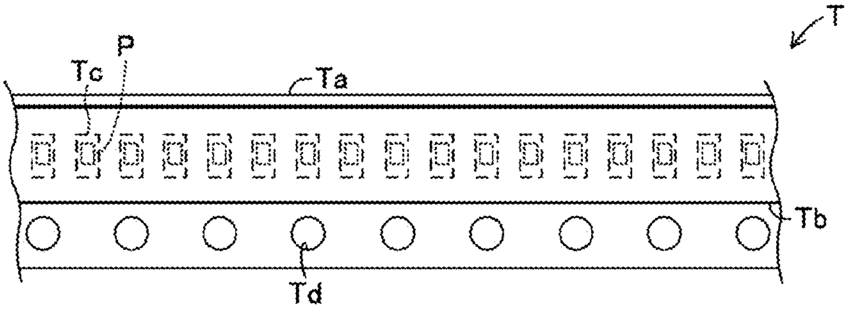
FIG. 2 is a top view schematically illustrating a carrier tape.
Figure 3:
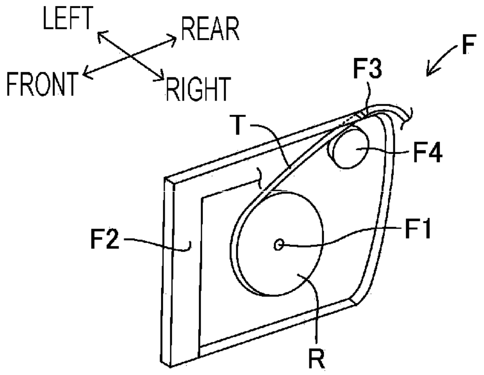
FIG. 3 is a perspective view schematically illustrating a main portion of a tape feeder.

Here, reel R, feeder F, and carrier tape T wound around reel R will be described with reference to FIGS. 2 and 3. First, as illustrated in FIG. 2, in carrier tape T, cover tape Tb is adhered to an upper surface side of base tape Ta, and cavities Tc for accommodating components P of base tape Ta are provided at a constant pitch. In general, base tape Ta is formed using a flexible material such as a paper material or a resin, and cover tape Tb is formed using a transparent and flexible high molecular weight film or the like.

Further, carrier tape T is provided with multiple feed holes Td along one side edge. Then, carrier tape T, more specifically, front end portions of base tape Ta and cover tape Tb are subjected to a process according to the type of feeder F into which reel R is loaded by automatic tape processing device 10 as described later.

Reel R includes multiple types in which the state and material of the front end of carrier tape T to be wound are different, and a tape width dimension of carrier tape T and a width dimension of reel R are different. There are also multiple types of feeders F into which reels R of different types are loaded. Therefore, although not illustrated in the drawings, an identification code (for example, a barcode, a two-dimensional code, or the like) is displayed on each reel R as image information for identifying individual reel R and identifying the type of feeder F to be loaded.

Feeder F is loaded with reel R around which carrier tape T processed by automatic tape processing device 10 is wound, and feeds carrier tape T in component mounter 5 to supply component P. As illustrated in FIG. 3, feeder F has a small width in a left-right direction. Feeder F has reel holding shaft F1 protruding rightward from a left side plate at a substantially central position when viewed from the side. Reel holding shaft F1 is fitted into a center hole formed at a center of reel R to detachably and rotatably hold reel R. A central portion of right side plate F2 of feeder F is widely opened in order to facilitate attachment and detachment of reel R.

Feeder F further includes component supply position F3, sprocket F4, and an unillustrated tape peeling section. Component supply position F3 is provided near a rear end of an upper surface of feeder F. Sprocket F4 is rotatably provided on the front side of component supply position F3. The teeth of sprocket F4 are fitted with feed holes Td of carrier tape T. Sprocket F4 is intermittently driven by a drive motor (not illustrated) and feeds carrier tape T at constant pitches. The tape peeling section passes component supply position F3 in a state (so-called semi-peeled state) where one side edge of cover tape Tb constituting carrier tape T is peeled off from base tape Ta, and enables component P to be taken out in component mounter 5. After passing through component supply position F3, carrier tape T is cut by, for example, a tape cutting device provided in component mounter 5.

Although not illustrated, an identification code (for example, a barcode or a two-dimensional code) as image information for identifying the type of feeder F is displayed on each of feeders F. Feeder F is provided with a feeder control section (not illustrated). The feeder control section stores identification information for identifying feeder F and reel R, and controls the component supply operation. When feeder F is held by reel loading device 20, the feeder control section can communicate with the outside (for example, control device 18 and main control section 28 described later) by automatically fitting a connector (not illustrated).

2. Configuration of Automatic Tape Processing Device 10

Next, the configuration of automatic tape processing device 10 will be described. Automatic tape processing device 10 of the present embodiment is arranged in offline setup area 4 of production line S as described above. For example, automatic tape processing device 10 processes the state of the front end of carrier tape T, that is, the tape front end state, according to the type of feeder F to be loaded in the future with respect to carrier tape T wound around reel R conveyed by reel carrier 1 to offline setup area 4.

Figure 4:
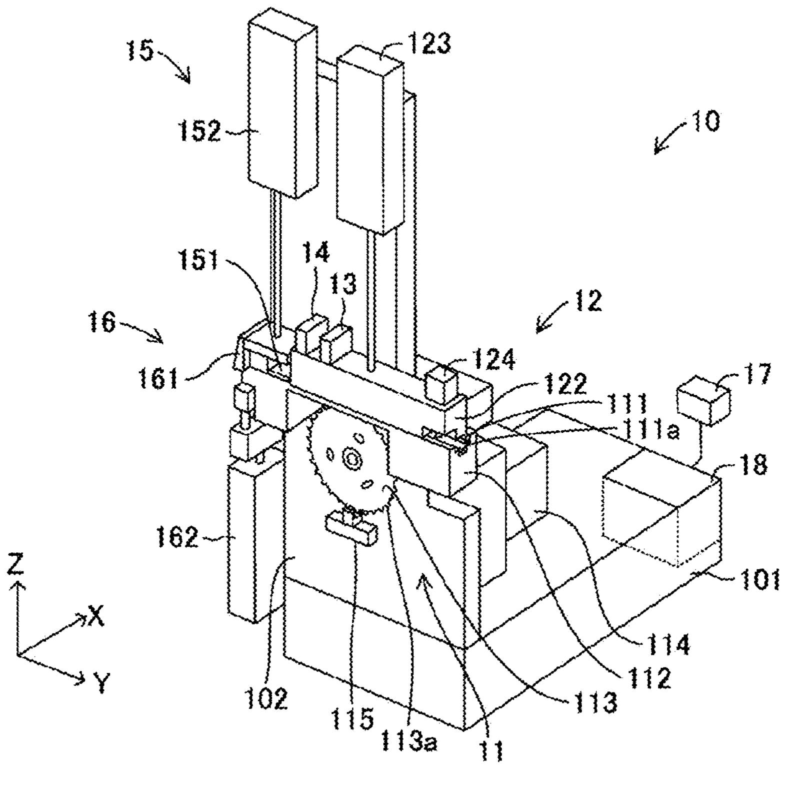
FIG. 4 is a perspective view illustrating a configuration of an automatic tape processing device.
Figure 5:
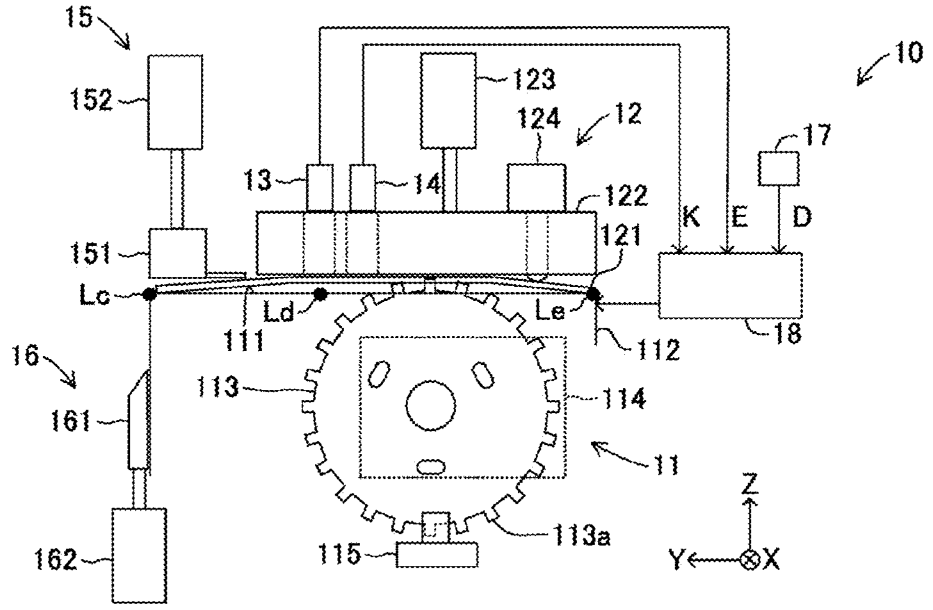
FIG. 5 is a side view illustrating the configuration of the automatic tape processing device of FIG. 4.

As illustrated in FIGS. 4 and 5, automatic tape processing device 10 includes feeding device 11, guide device 12, component presence/absence detection device 13, state detection device 14, peeling device 15, cutting device 16, determination device 17, and control device 18. Here, feeding device 11, guide device 12, peeling device 15, and cutting device 16 are disposed on support plate 102 vertically fixed to base 101 of automatic tape processing device 10.

Feeding device 11 is a device that conveys (pitch feeds) carrier tape T along conveyance path 111. Feeding device 11 includes sprocket 113 disposed below conveyance member 112 provided with conveyance path 111, gear motor 114 connected to sprocket 113, and sprocket tooth detection device 115 disposed near sprocket 113. Feeding device 11 conveys carrier tape T along conveyance path 111, and subsequently positions cutting portion Q1 of base tape Ta and cutting portion Q2 of cover tape Tb at cutting position Lc.

Conveyance path 111 has a width slightly larger than the width of carrier tape T, and is formed as a groove extending linearly from tape inlet Le of conveyance member 112 to cutting position Lc. Further, narrow groove 111*a* for passing cavity Tc in which component P is accommodated is formed in conveyance path 111.

In sprocket 113, multiple teeth 113*a* having the same pitch as the pitch of feed holes Td provided in carrier tape T are formed in a circumferential direction. Sprocket 113 is disposed below conveyance path 111 so that uppermost tooth 113*a* of rotating teeth 113*a* can mesh with feed hole Td of carrier tape T inserted along conveyance path 111.

Gear motor 114 is, for example, a stepping motor. Gear motor 114 is a motor capable of controlling the positions of cutting portions Q1 and Q2 of base tape Ta and cover tape Tb of carrier tape T conveyed by the connected sprocket 113. Examples of sprocket tooth detection device 115 include a photosensor. Sprocket tooth detection device 115 detects that one of teeth 113*a* of sprocket 113 is directed vertically upward, that is, sprocket 113 is in the original position, by reading a mark provided on a side surface of sprocket 113.

Guide device 12 is disposed above feeding device 11. As illustrated in FIG. 5, guide device 12 includes pressing member 121 that presses carrier tape T, which is pitch fed along conveyance path 111, from the lower surface thereof, abutment member 122 that abuts on the upper surface of the pressed carrier tape T, air cylinder 123 that lifts and lowers abutment member 122, and tape detection sensor 124 that detects carrier tape T.

Pressing member 121 is, for example, a leaf spring, and is disposed in narrow groove 111*a* of conveyance path 111. Abutment member 122 is disposed to abut on and separate from conveyance member 112 by air cylinder 123. Tape detection sensor 124 detects that carrier tape T is inserted from tape inlet Le of conveyance member 112. Examples of tape detection sensor 124 include a touch sensor and a photosensor.

When carrier tape T is conveyed along conveyance path 111, guide device 12 guides carrier tape T with respect to the upper surface when abutment member 122 and conveyance member 112 abut on each other. When carrier tape T is conveyed along conveyance path 111, in a case where abutment member 122 and conveyance member 112 are separated from each other, guide device 12 guides carrier tape T in a state of being separated from conveyance path 111.

Component presence/absence detection device 13 detects the presence or absence of component P by detecting a change in the amount of light caused by cavity Tc of carrier tape T conveyed along conveyance path 111, the tape portion between cavities Tc, and component P in cavity Tc. Component presence/absence detection device 13 may include, for example, a photosensor, or may include a camera capable of imaging carrier tape T. Then, component presence/absence detection device 13 outputs, to control device 18, component detection signal E indicating transfer from cavity Tc in which component P is not accommodated to cavity Tc in which component P is accommodated.

State detection device 14 is a device that detects a tape front end state that is a state of the front end of carrier tape T. State detection device 14 may be, for example, an optical sensor that irradiates carrier tape T conveyed along conveyance path 111 with light and receives light reflected by carrier tape T. State detection device 14 may include an imaging element capable of imaging carrier tape T, and may detect the tape front end state based on an image captured by the imaging element.

In the case of using the optical sensor, for example, when the light intensity at the time of receiving the reflected light is larger than a predetermined first reference, state detection device 14 detects the state in which base tape Ta and cover tape Tb are both present as the tape front end state. Further, for example, when the light intensity at the time of receiving the reflected light is larger than a predetermined second reference and smaller than the first reference, state detection device 14 detects a state in which air is present between base tape Ta and cover tape Tb and light is scattered, that is, detects a state in which cover tape Tb is peeled off from base tape Ta, as the tape front end state. Meanwhile, when the light intensity at the time of receiving the reflected light is smaller than a predetermined third reference which is smaller than the second reference, state detection device 14 detects the state where only the transparent cover tape Tb is present, as the tape front end state. Then, state detection device 14 outputs detection result K indicating the detected tape front end state, that is, the actual tape front end state, to control device 18.

Here, the tape front end state of carrier tape T wound around reel R is different between a case where carrier tape T is new and a case where carrier tape T is reused. In the case of new carrier tape T, for example, a tape front end state in which a front end-side end portion of cover tape Tb protrudes from a front end-side end portion of base tape Ta and cover tape Tb is not peeled off from base tape Ta can be exemplified. Meanwhile, in the case of reuse carrier tape T, for example, a tape front end state in which the front end-side end portion of base tape Ta and the front end-side end portion of cover tape Tb are aligned and cover tape Tb is semi-peeled off from base tape Ta can be exemplified. Further, in the case of reuse carrier tape T, for example, a tape front end state in which the front end-side end portion of cover tape Tb protrudes from the front end-side end portion of base tape Ta and cover tape Tb is peeled off from base tape Ta by a predetermined distance can be exemplified.

Figure 6:
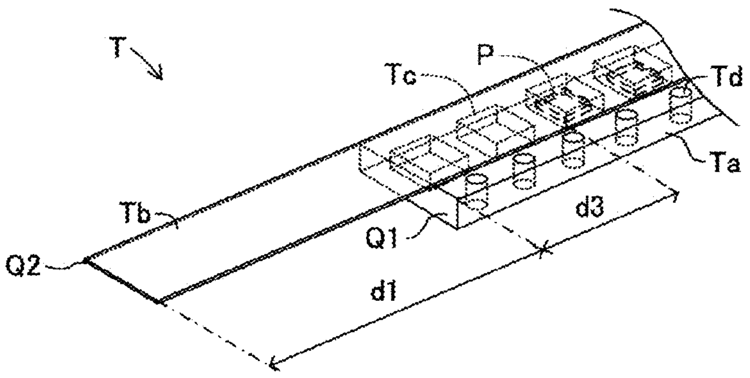
FIG. 6 is a perspective view illustrating a tape front end state of the carrier tape.
Figure 7:
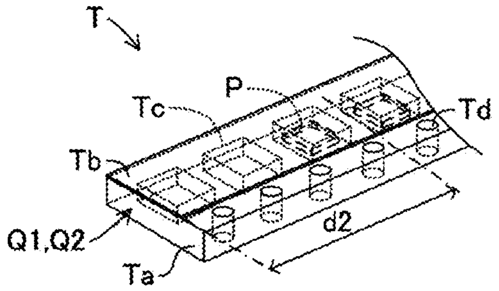
FIG. 7 is a perspective view illustrating the tape front end state of the carrier tape.

Therefore, the tape front end state (actual tape front end state) detected by state detection device 14 includes a peeled state of cover tape Tb peeled from base tape Ta. More specifically, the peeled state detected by state detection device 14 includes surplus length d1 of cover tape Tb peeled off from base tape Ta illustrated in FIG. 6 and surplus from the front end of base tape Ta, and peeled length d2 of cover tape Tb peeled off from base tape Ta illustrated in FIG. 7. The tape front end state may include, for example, the number of empty cavities Tc that can be detected by component presence/absence detection device 13 and that do not accommodate component P from the front end of carrier tape T.

Peeling device 15 is disposed above feeding device 11, and includes scraper 151 that peels off cover tape Tb from base tape Ta of carrier tape T conveyed along conveyance path 111, and air cylinder 152 that lifts and lowers scraper 151. Scraper 151 is provided with a blade edge capable of entering between base tape Ta and cover tape Tb of carrier tape T. Scraper 151 is disposed to be positioned at a position between base tape Ta and cover tape Tb of carrier tape T conveyed along conveyance path 111 by air cylinder 152 and at a retreat position above carrier tape T.

As illustrated in FIG. 5, cutting device 16 includes cutter 161 provided at cutting position Lc in conveyance path 111, and air cylinder 162 for lifting and lowering cutter 161. Cutter 161 is a single-blade cutter having a width larger than the width of carrier tape T. Cutter 161 is disposed to be movable in an up-down direction by air cylinder 162 in order to cut cutting portions Q1 and Q2 (refer to FIGS. 6 and 7) of base tape Ta and cover tape Tb positioned at cutting position Lc on conveyance path 111.

Determination device 17 is a device that determines the type of feeder F into which carrier tape T, that is, reel R is loaded. Determination device 17 is, for example, a scanner or the like having an imaging device such as a camera, and reads an identification code (barcode, two-dimensional code, or the like) which is image information displayed on reel R (or feeder F) conveyed to offline setup area 4. Then, determination device 17 determines the type of feeder F based on the read identification code, and outputs determination result D indicating the determined type of feeder F to control device 18.

Here, determination device 17 is not limited to reading the identification code and determining the type of feeder F. Specifically, for example, determination device 17 can communicate with a feeder control section of feeder F and determine the type of feeder F based on identification information acquired through communication. Alternatively, determination device 17 can communicate with a host computer that is provided in production line S and collectively manages the production, and determine the type of feeder F based on the identification information of feeder F included in the information acquired through the communication. Also in this case, determination device 17 outputs determination result D indicating the determined type of feeder F to control device 18.

Control device 18 is a microcomputer including CPU, ROM, RAM, and various interfaces as main components. Control device 18 acquires component detection signal E from component presence/absence detection device 13, detection result K from state detection device 14, and determination result D from determination device 17. Control device 18 stores in advance a target tape front end state indicating the tape front end state of carrier tape T corresponding to each type of feeder F.

Then, control device 18 specifies the type of feeder F into which reel R is loaded based on determination result D by determination device 17, and collectively controls the operation of automatic tape processing device 10 so that the target tape front end state corresponding to specified feeder F is achieved. That is, control device 18 determines cutting portion Q1 of base tape Ta and cutting portion Q2 of cover tape Tb so that the actual tape front end state indicating the front end state of carrier tape T detected by state detection device 14 becomes the target tape front end state, and controls the operation of automatic tape processing device 10.

3. Operation of Automatic Tape Processing Device 10

Next, the operation of automatic tape processing device 10 of the present embodiment will be described. As described above, automatic tape processing device 10 of the present embodiment is disposed in offline setup area 4. Then, automatic tape processing device 10 automatically processes the tape front end state of carrier tape T conveyed together with reel R by reel carrier 1 to the target tape front end state corresponding to the type of feeder F. Here, in the following description, a case will be exemplified in which automatic tape processing device 10 performs processing such that the tape front end state (actual tape front end state) of carrier tape T is set to a state (refer to FIG. 6) in which cover tape Tb is surplus (protrudes) by surplus length d1 to correspond to determined feeder F.

When reel R around which carrier tape T is wound is conveyed to offline setup area 4 by reel carrier 1, for example, the worker reads the identification code displayed on reel R using determination device 17. Accordingly, determination device 17 determines the type of feeder F in which reel R is loaded, and outputs determination result D indicating the type of feeder F to control device 18.

Figure 8:
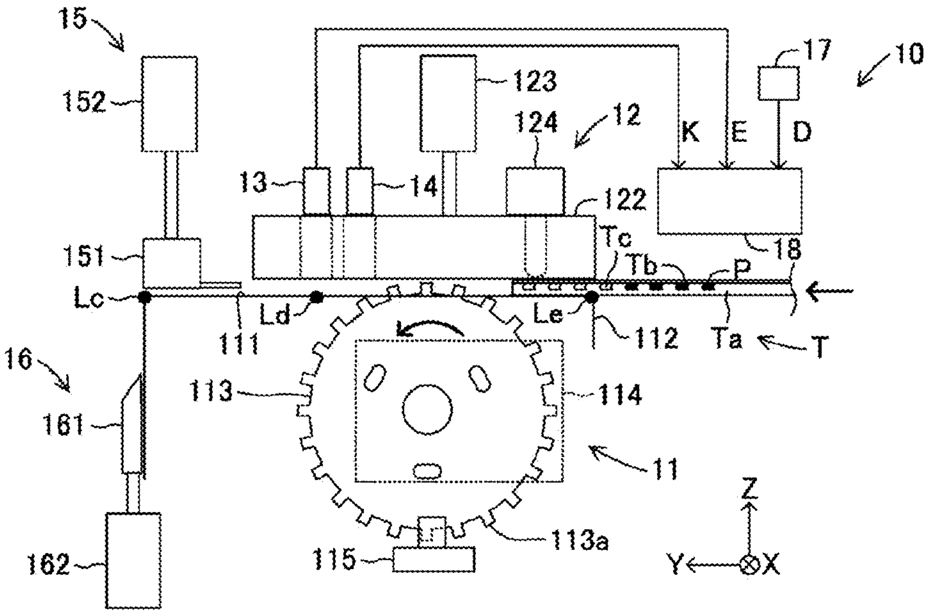
FIG. 8 is a view illustrating a state in which the carrier tape is inserted into the automatic tape processing device.

When determination result D is acquired from determination device 17, control device 18 rotates sprocket 113 of feeding device 11 and aligns sprocket 113 with the original position based on the detection signal from sprocket tooth detection device 115 (refer to FIG. 5). Subsequently, when the front end of carrier tape T is inserted into conveyance path 111 of conveyance member 112 from tape inlet Le based on the detection signal from tape detection sensor 124 of guide device 12, control device 18 rotates sprocket 113 as illustrated in FIG. 8. The insertion of carrier tape T into tape inlet Le may be performed by a worker or may be performed by another conveyance device (not illustrated).

Figure 9:
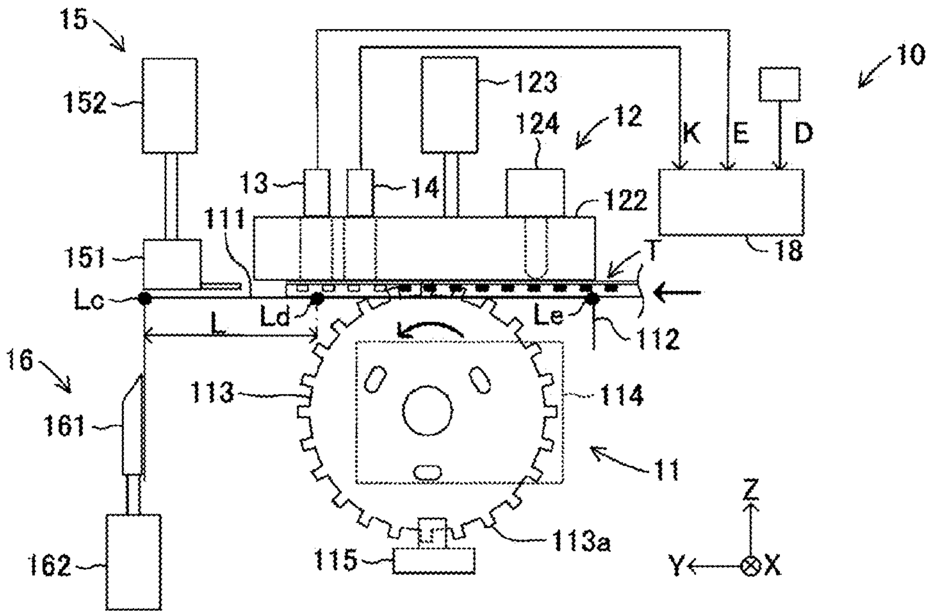
FIG. 9 is a view illustrating detection of the tape front end state and detection of presence or absence of a component in the automatic tape processing device.

In this way, carrier tape T is fed out from reel R by rotating sprocket 113, and carrier tape T is conveyed along conveyance path 111. Then, as illustrated in FIG. 9, state detection device 14 detects the actual tape front end state of carrier tape T moving along conveyance path 111. Accordingly, state detection device 14 outputs detection result K indicating the current actual tape front end state of carrier tape T to control device 18.

Control device 18 determines cutting portion Q1 of base tape Ta and cutting portion Q2 of cover tape Tb based on detection result K such that the actual tape front end state of carrier tape T becomes the target tape front end state corresponding to feeder F. That is, based on detection result K, for example, when the state is the actual tape front end state in which carrier tape T is new and the front end-side end portion of base tape Ta and the front end-side end portion of cover tape Tb are aligned with each other as illustrated in FIG. 9, control device 18 determines cutting portion Q1 of base tape Ta to secure an appropriate surplus length of cover tape Tb.

Here, control device 18 can receive component detection signal E when transfer is made from empty cavity Tc (indicated by a white square in FIG. 9) from component presence/absence detection device 13 to cavity Tc (indicated by a black square in FIG. 9) in which component P is present. In this case, control device 18 can complement cutting portion Q1 determined based on the target tape front end state, for example, in consideration of the presence of empty cavity Tc. Specifically, as illustrated in FIG. 9, control device 18 can calculate and determine cutting portion Q1 of base tape Ta from distance d3 set in advance (refer to FIG. 6) from the front end of base tape Ta to leading component P and distance L between known detection position Ld and cutting position Lc.

Figure 10:
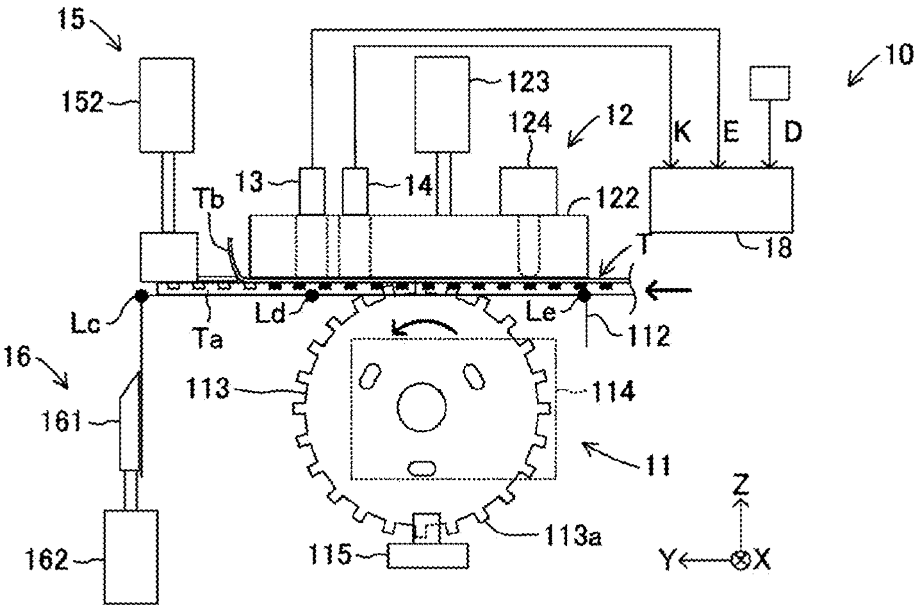
FIG. 10 is a view illustrating peeling of a cover tape in the automatic tape processing device.

Subsequently, as illustrated in FIG. 10, control device 18 continues to convey carrier tape T and causes scraper 151 of peeling device 15 to peel off cover tape Tb from base tape Ta. Here, for example, when the actual tape front end state is processed to have peeled length d2 illustrated in FIG. 7, control device 18 can convey carrier tape T by peeled length d2 and peel cover tape Tb from base tape Ta. Peeled cover tape Tb is temporarily stored above peeling device 15.

Figure 11:
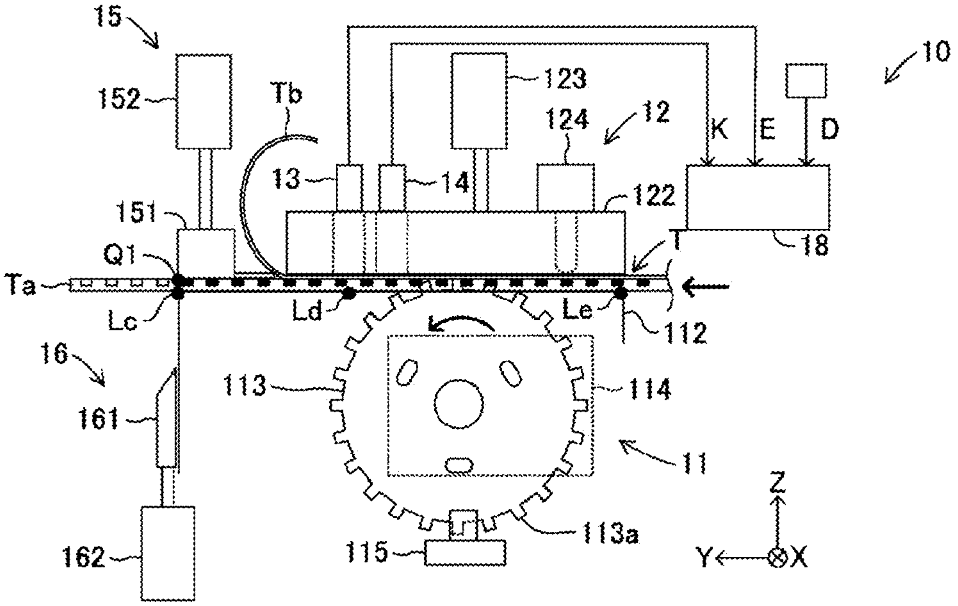
FIG. 11 is a view illustrating positioning a cutting portion of a base tape at a cutting position in the automatic tape processing device.

Then, as illustrated in FIG. 11, control device 18 further conveys carrier tape T to position cutting portion Q1 of base tape Ta at cutting position Lc, and stops the rotation of sprocket 113. When cutting portion Q1 of base tape Ta is positioned at cutting position Lc, control device 18 controls the feeding amount of base tape Ta (that is, carrier tape T) based on, for example, the pulse count number of gear motor 114 that drives sprocket 113.

Figure 12:
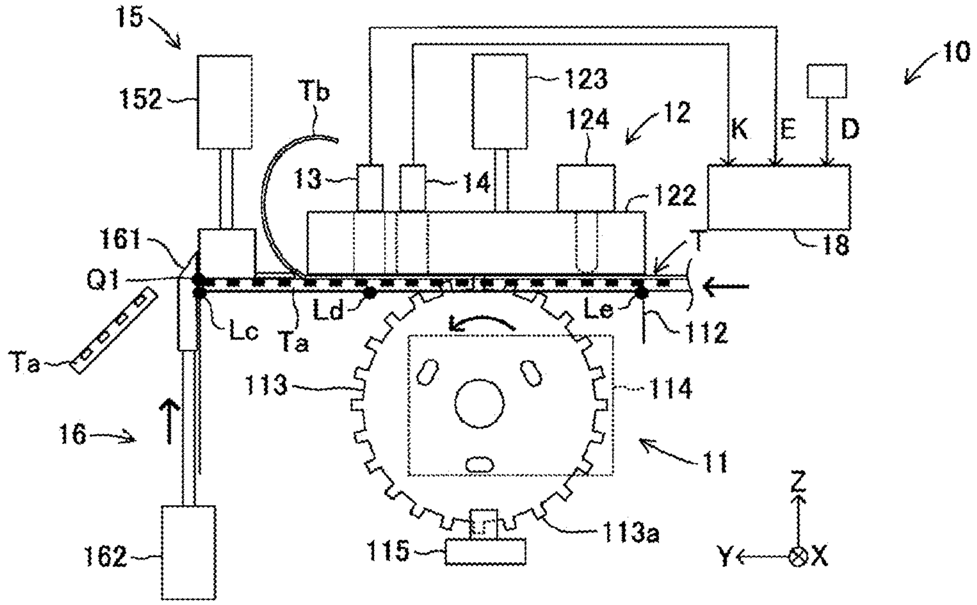
FIG. 12 is a view illustrating cutting of the base tape in the automatic tape processing device.
Figure 13:
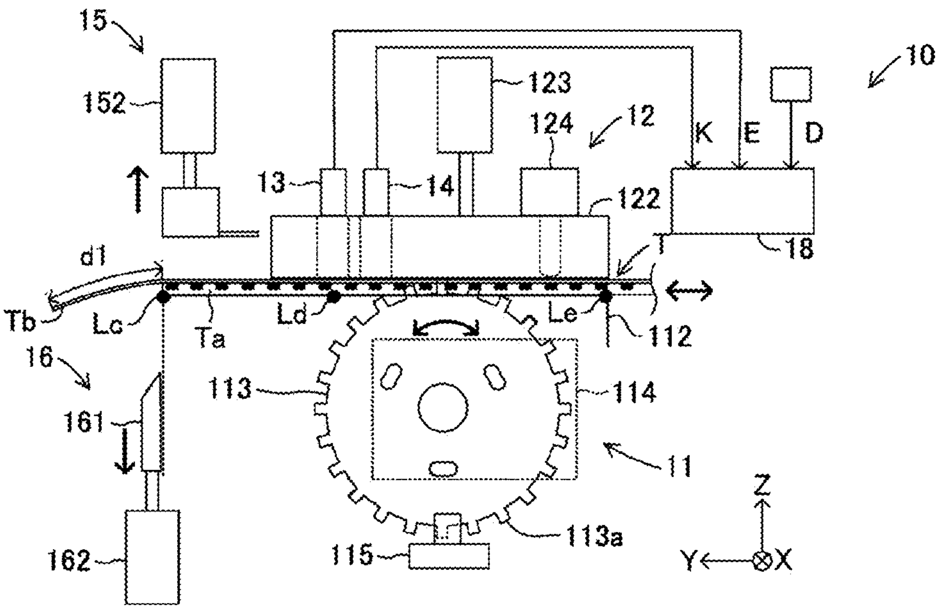
FIG. 13 is a view illustrating protrusion of the cover tape in the automatic tape processing device.

When cutting portion Q1 of base tape Ta is positioned at cutting position Lc, as illustrated in FIG. 12, control device 18 lifts cutter 161 of cutting device 16 to cut cutting portion Q1 of base tape Ta positioned at cutting position Lc. Then, as illustrated in FIG. 13, control device 18 lifts scraper 151 to the standby position and rotates sprocket 113 forward and backward. Then, control device 18 feeds cover tape Tb temporarily stored above peeling device 15 to the front of base tape Ta, and stops the rotation of sprocket 113. Accordingly, carrier tape T is in the actual tape front end state in which cover tape Tb is surplus from the front end of cut base tape Ta by predetermined surplus length d1 set in advance to be in the target tape front end state.

Figure 14:
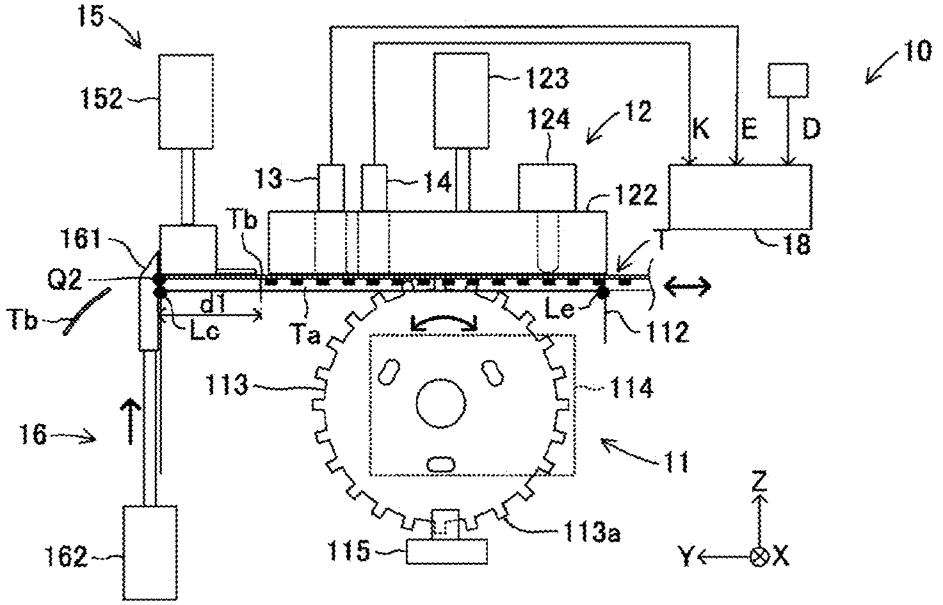
FIG. 14 is a view illustrating cutting of the cover tape in the automatic tape processing device.

When surplus length d1 of cover tape Tb in the actual tape front end state is longer than the target protruding length of cover tape Tb in the target tape front end state, control device 18 determines cutting portion Q2 at which surplus length d1 of cover tape Tb becomes the target protruding length. Then, as illustrated in FIG. 14, for example, control device 18 positions cutting portion Q2 at cutting position Lc by reversely rotating sprocket 113 based on detection result K from state detection device 14 after cutting base tape Ta as described above, and cuts cover tape Tb. Accordingly, surplus length d1 of cover tape Tb is set, and the actual tape front end state of carrier tape T can be accurately matched with the target tape front end state.

In a case where the tape front end state (actual tape front end state) of carrier tape T is set to correspond to determined feeder F, and base tape Ta and cover tape Tb are aligned (refer to FIG. 7), control device 18 determines cutting portions Q1 and Q2 to be the same value. Then, control device 18 positions cutting portion Q1 of base tape Ta and cutting portion Q2 of cover tape Tb at cutting position Lc, and cuts base tape Ta and cover tape Tb by cutter 161 of cutting device 16. Accordingly, the actual tape front end state of carrier tape T can be accurately matched with the target tape front end state.

4. Configuration of Reel Loading Device 20

Next, the configuration of reel loading device 20 will be described using FIG. 15, FIG. 16, and FIG. 17. Reel loading device 20 includes reel attachment/detachment section 21, reel supply section 23, and feeder supply section 25. Each drawing is a schematic illustration view, and some members are omitted to be easily seen.

Reel attachment/detachment section 21 is configured by assembling various members inside device housing 22. Device housing 22 is a case having a large rectangular parallelepiped shape, and a front side and a left side thereof are partially opened. Reel supply section 23 is disposed to be coupled to the front side of reel attachment/detachment section 21. Reel supply section 23 includes base 24 having a box shape corresponding to a device housing smaller than device housing 22. Feeder supply section 25 is disposed to be coupled to the left side of reel attachment/detachment section 21. Feeder supply section 25 includes device housing 26 which is smaller than device housing 22 and has storage space 261 in an upper portion thereof.

Reel attachment/detachment section 21 includes feeder holding section 211, reel attachment mechanism 212, tape loading mechanism 213, and reel removal mechanism 214. As illustrated in FIG. 16, feeder holding section 211 is disposed at a position close to the left front inside device housing 22. Feeder holding section 211 holds feeder F at a work execution position in a vertical posture. As illustrated in FIG. 17, feeder holding section 211 includes bottom plate 211*a* and support plate 211*b*. Bottom plate 211 a has groove-shaped slot 211*c* extending in a front-rear direction. Feeder F is inserted from the front side to the rear side of slot 211*c* and is held at the work execution position. Support plate 211*b* is erected from bottom plate 211*a* and contacts the left side surface of feeder F at the work execution position. Support plate 211*b* supports a lateral pressing load generated when reel R is attached to feeder F.

Reel attachment mechanism 212 is disposed on the right side of feeder holding section 211. Reel attachment mechanism 212 includes reel transfer mechanism 232 described later. Reel attachment mechanism 212 changes reel R from a lying down posture to the vertical posture, and attaches reel R to feeder F at the work execution position. Reel attachment mechanism 212 includes pair of guide rails 212*a*, moving table 212*b*, collection section 212*c*, placement area 212*d*, temporary placement area 212*e*, and the like.

Reel attachment mechanism 212 may have a configuration in which a mechanism that changes reel R from the lying down posture to the vertical posture and a mechanism that holds reel R in the vertical posture and attaches reel R to feeder F are separated. Further, collection section 212*c* detachably collects reel R, and can use a claw portion formed on reel R or a gripping mechanism that grips the peripheral edge of reel R, a picking-up mechanism that picks up reel R using negative pressure, or the like.

Figure 15:
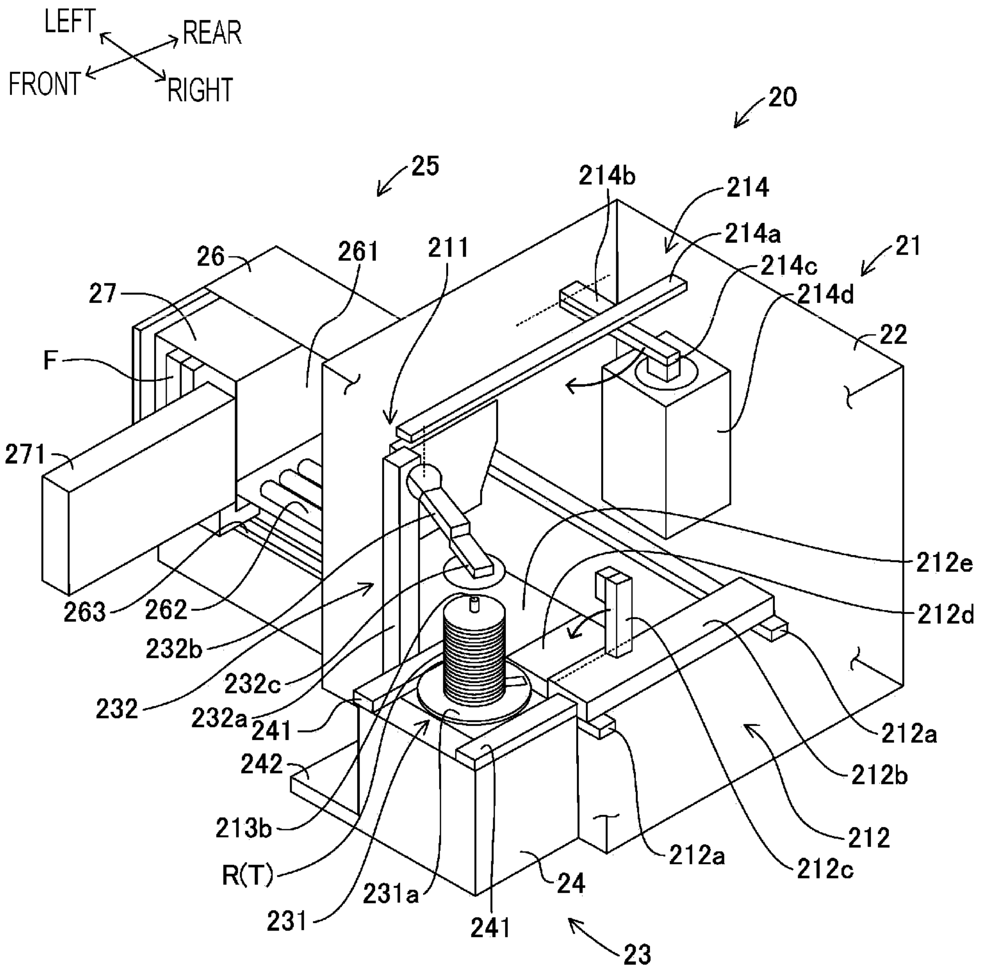
FIG. 15 is a perspective view illustrating the configuration of a reel loading device.
Figure 16:
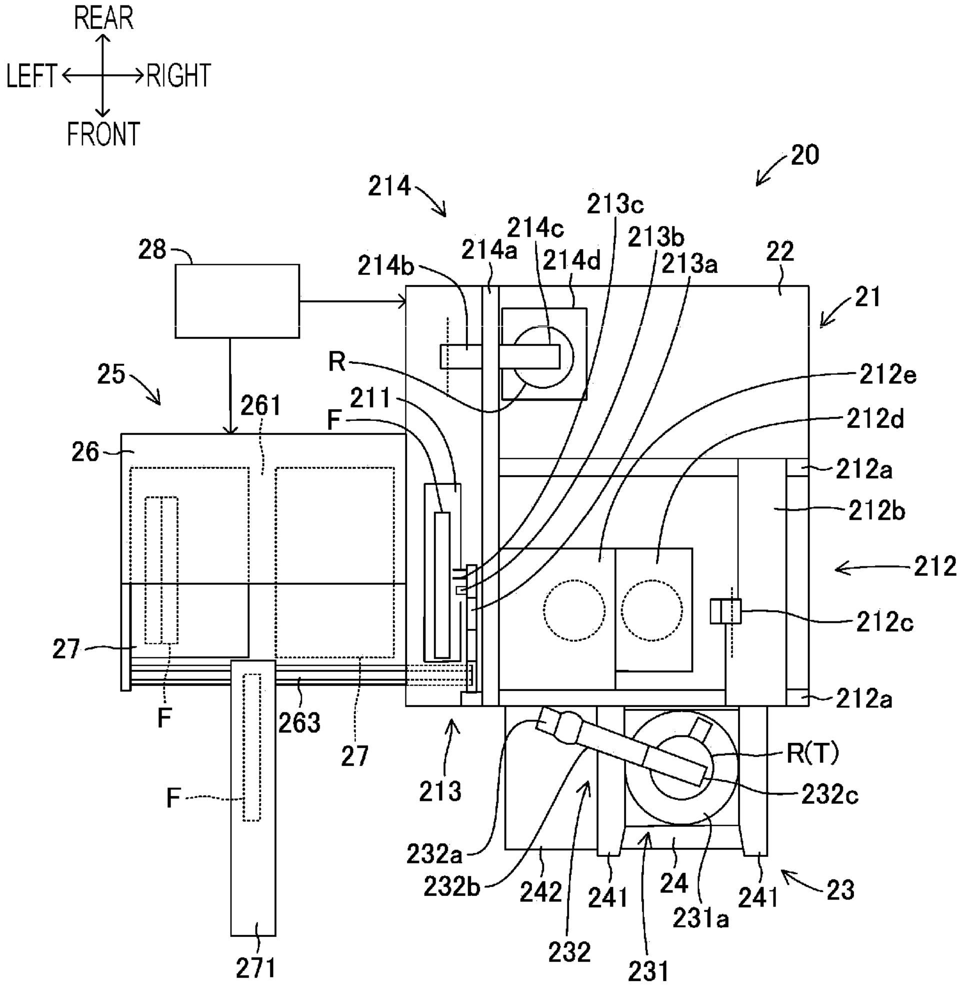
FIG. 16 is a plan view illustrating a configuration of the reel loading device in FIG. 15.
Figure 17:
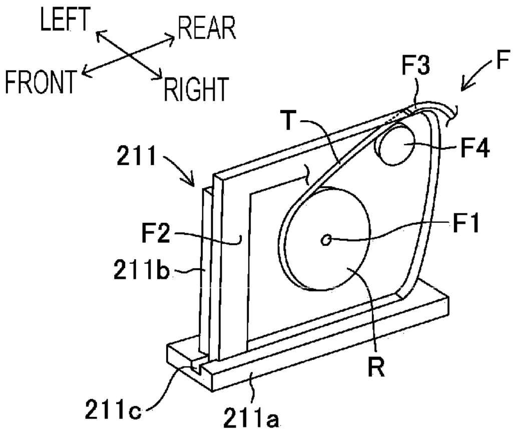
FIG. 17 is a perspective view illustrating a configuration of a feeder holding section of the reel loading device.

As illustrated in FIG. 16, tape loading mechanism 213 is disposed close to feeder holding section 211 (not illustrated in FIG. 15). Tape loading mechanism 213 loads carrier tape T in feeder F so that carrier tape T can be fed. Tape loading mechanism 213 includes, for example, an articulated robot, and includes, as a specific example, articulated arm 213*a*, camera 213*b*, multiple fingers 213*c*, and the like.

Articulated arm 213*a* can freely perform operations such as rotation and bending of the arm, and freely adjusts the positions and orientations of camera 213*b* and finger 213*c*. Camera 213*b* is provided at the front end portion of articulated arm 213*a*. Camera 213*b* images feeder F at the work execution position to detect the positions and the states of reel R and carrier tape T. Multiple fingers 213*c* are provided side by side with camera 213*b* at the front end portion of articulated arm 213*a*. Multiple fingers 213*c* can perform a moving operation, a twisting operation, and the like in addition to the operation of gripping and releasing a work target.

Multiple fingers 213*c* are loaded until the front end of carrier tape T processed by automatic tape processing device 10 is engaged with sprocket F4 to be in a feedable state. Multiple fingers 213*c* can facilitate the loading operation and the like by rotating reel R around reel holding shaft F1 as necessary. Tape loading mechanism 213 takes a retracted posture in which articulated arm 213*a* is bent not to hinder the attaching and detaching operation of reel R in a time period other than the operation time.

Reel removal mechanism 214 is disposed on the right side of feeder holding section 211 and is located above reel attachment mechanism 212. Reel removal mechanism 214 removes reel R from feeder F at the work execution position. Reel removal mechanism 214 includes guide rail 214*a*, moving table 214*b*, collection section 214*c*, collection box 214*d*, and the like. The collecting method of collection section 214*c* may be the same as or different from that of collection section 212*c* of reel attachment mechanism 212. Collection box 214*d* collectively collects multiple removed reels R, and automatically collects reels R that fall when collection section 214*c* releases.

Reel supply section 23 includes reel holding section 231 detachably. Reel holding section 231 is conveyed by reel carrier 1 and placed between pair of guide plates 241 of base 24. Reel holding section 231 stacks and holds multiple reels R (for example, 20 reels) in the lying down posture. As described above, carrier tape T wound around reel R is not limited to a new one, and may be used up to the middle. Reel holding section 231 includes circular plate-shaped holding plate 231 a that is horizontally disposed, and round rodshaped holding shaft 231*b* that is provided upright upward from the center of holding plate 231*a* and is fitted into the center hole of reel R.

Reel supply section 23 further includes reel transfer mechanism 232. Reel transfer mechanism 232 is disposed on plate seat 242 extending leftward from a bottom portion of base 24. Reel transfer mechanism 232 functions as a part of reel attachment mechanism 212. Reel transfer mechanism 232 includes support column 232*a*, arm 232*b*, and collection section 232*c*. Support column 232*a* stands vertically upward from a position near the rear portion of plate seat 242. Arm 232*b* is provided to be lifted and lowered with respect to support column 232*a*. The collecting method of collection section 232*c* may be the same as or different from collection section 212*c* of reel attachment mechanism 212 and collection section 214*c* of reel removal mechanism 214.

Feeder supply section 25 detachably includes feeder accommodation section 27, and further includes feeder conveyance section 271. As illustrated in FIG. 16, storage space 261 in the upper portion of device housing 26 is open forward, and two feeder accommodation sections 27 can be stored side by side in the left-right direction. Multiple roller conveyors 262 (refer to FIG. 15) extending in the left-right direction are provided on the bottom surface defining storage space 261, thereby facilitating the storage operation of feeder accommodation section 27.

Feeder accommodation section 27 is formed in a box shape with an open front side. Multiple slots having the same shape as slot 211*c* of feeder holding section 211 are formed on the bottom surface of feeder accommodation section 27. Feeder accommodation section 27 accommodates multiple (for example, 20) feeders F arranged in the left-right direction in a vertical posture. When multiple feeders F are accommodated in feeder accommodation section 27 and feeder accommodation section 27 is stored in storage space 261, multiple feeder control sections are communicably connected to main control section 28 by automatically fitting a connector (not illustrated).

Guide rail 263 is provided in a front lower portion of storage space 261 of device housing 26. Guide rail 263 extends substantially entirely in the left-right direction of storage space 261, and further extends to the front side of feeder holding section 211. Feeder conveyance section 271 is mounted on guide rail 263. Feeder conveyance section 271 reciprocates between feeder accommodation section 27 and feeder holding section 211 along guide rail 263.

Feeder conveyance section 271 is formed in a box shape having an opening portion on the rear side. Feeder conveyance section 271 includes an accommodation space for temporarily accommodating feeder F and a feeder operation mechanism that takes feeder F into and out of the accommodation space via the opening portion. Accordingly, feeder conveyance section 271 can pull out feeder F from feeder accommodation section 27 or feeder holding section 211, or can insert feeder F into feeder accommodation section 27 or feeder holding section 211.

As illustrated in FIG. 16, main control section 28 is electrically connected to reel loading device 20 (not illustrated in FIG. 15). Main control section 28 is a microcomputer including CPU, ROM, RAM, and various interfaces as main components. Main control section 28 communicates with the feeder control section of feeder F and executes various programs (not illustrated), thereby collectively controlling the operation of reel loading device 20. Accordingly, reel loading device 20 can automatically load reel R around which carrier tape T whose tape front end state has been processed by automatic tape processing device 10 is wound into the corresponding feeder F.

As can be understood from the above description, automatic tape processing device 10 includes feeding device 11 in which cover tape Tb is adhered to the upper surface side of base tape Ta in which cavities Tc for accommodating components P are provided at a constant pitch, feeding device 11 conveying carrier tape T to be loaded into feeder F, cutting device 16 configured to cut base tape Ta and cover tape Tb at cutting portions Q1 and Q2, and control device 18 configured to determine cutting portions Q1 and Q2 of base tape Ta and cover tape Tb according to the type of feeder F, and control the operations of feeding device 11 and cutting device 16 so that base tape Ta and cover tape Tb are cut at determined cutting portions Q1 and Q2.

Accordingly, control device 18 can automatically determine cutting portions Q1 and Q2 of base tape Ta and cover tape Tb according to the type of feeder F in which carrier tape T is loaded. Then, control device 18 can operate feeding device 11 and cutting device 16 such that base tape Ta and cover tape Tb are cut at determined cutting portions Q1 and Q2. Accordingly, it is possible to perform automation that eliminates instruction input and manual work by the worker when processing the front end of carrier tape T, and it is possible to reduce the burden on the worker and reduce work errors. As a result, the efficiency of loading carrier tape T into the tape feeder can be improved.

5. First Modification Example

In the above-described embodiment, automatic tape processing device 10 cuts base tape Ta and cover tape Tb or peels off cover tape Tb according to the type of feeder F. Accordingly, automatic tape processing device 10 matches the actual tape front end state of carrier tape T with the target tape front end state corresponding to the type of feeder F.

Figure 18:
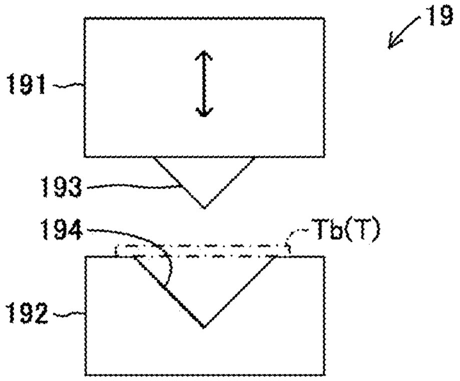
FIG. 18 is a view illustrating a forming device for forming a front end shape of a carrier tape according to a first modification example.

In particular, in the case where cover tape Tb is in the actual tape front end state having surplus length d1, since cover tape Tb is formed of a flexible resin or the like, depending on the type of feeder F, for example, deformation of cover tape Tb during loading of carrier tape T into feeder F may delay the loading work. In order to deal with this, as illustrated in FIG. 18, automatic tape processing device 10 may include forming device 19 that forms the front end shape of carrier tape T (in particular, cover tape Tb) according to the type of feeder F.

Figure 19:
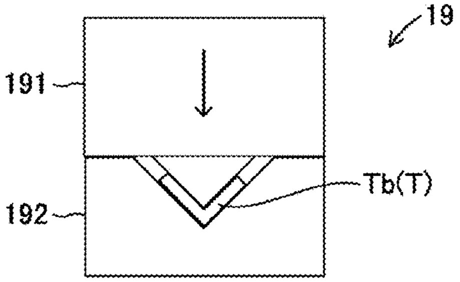
FIG. 19 is a view illustrating the forming of the front end shape of the carrier tape (cover tape) by the forming device of FIG. 18.

Forming device 19 includes upper die 191 and lower die 192 to and from which upper die 191 approaches and separates. Upper die 191 has protruding portion 193 protruding toward lower die 192, and lower die 192 has recessed portion 194 capable of accommodating protruding portion 193 of upper die 191. Accordingly, in a state where cover tape Tb is disposed to cover recessed portion 194 at the upper portion of lower die 192 as illustrated in FIG. 18, upper die 191 is brought close to lower die 192 as illustrated in FIG. 19. Accordingly, by forming a valley shape in cover tape Tb along the longitudinal direction of carrier tape T, stiffness (resistance against bending) can be applied to the front end of cover tape Tb made of a flexible resin.

Accordingly, when carrier tape T (more specifically, reel R) is loaded into feeder F, for example, the front end of carrier tape T (more specifically, cover tape Tb) easily passes through the conveyance path of feeder F. As a result, when the front end shape is formed by forming device 19, carrier tape T can be easily loaded normally, and the loading time can be shortened.

The front end shape that can be formed by forming device 19 can be determined according to the type of feeder F. Accordingly, it is needless to say that forming device 19 can form a shape other than forming a valley shape in cover tape Tb as a front end shape.

6. Other Modification Examples

In the embodiment described above, automatic tape processing device 10 and reel loading device 20 are independently disposed in production line S. In the embodiment described above, reel R around which carrier tape T processed by automatic tape processing device 10 is wound is conveyed to reel loading device 20 by reel carrier 1.

Alternatively, for example, automatic tape processing device 10 may be provided integrally with reel loading device 20. Accordingly, the time until reel R around which carrier tape T is wound is loaded into feeder F can be shortened.

In the above-described embodiment, surplus length d1, peeled length d2, the number of empty cavities Tc, and the like are exemplified in the tape front end state. However, in addition to this, the tape front end state can also be exemplified as a state in which empty cavity Tc is crushed. By crushing empty cavity Tc, for example, the front end of carrier tape T easily passes through the conveyance path of feeder F.

REFERENCE SIGNS LIST

1: reel carrier, 2: feeder carrier, 10: automatic tape processing device, 11: feeding device, 111: conveyance path, 112: conveyance member, 113: sprocket, 114: gear motor, 115: sprocket tooth detection device, 12: guide device, 121: pressing member, 122: abutment member, 123: air cylinder, 124: tape detection sensor, 13: component presence/absence detection device, 14: state detection device, 15: peeling device, 151: scraper, 152: air cylinder, 16: cutting device, 161: cutter, 162: air cylinder, 17: determination device, 18: control device, 20: reel loading device, 21: reel attachment/detachment section, 22: device housing, 23: reel supply section, 24: base, 25: feeder supply section, 26: device housing, 27: feeder accommodation section, 28: main control section, S: production line, T: carrier tape, Ta: base tape, Tb: cover tape, Tc: cavity, R: tape reel, F: tape feeder, F3: component supply position, K: detection result (actual tape front end state), E: component detection signal, D: determination result, Q1, Q2: cutting portion, Lc: cutting position, d1: surplus length, d2: peeled length

The invention claimed is:

1. An automatic tape processing device comprising:

a feeding device in which a cover tape is adhered to an upper surface side of a base tape in which cavities configured to accommodate a component are provided at a constant pitch, the feeding device being configured to convey a carrier tape to be loaded into a tape feeder;

a cutting device configured to cut each of the base tape and the cover tape at a cutting portion;

a state detection device configured to detect a tape front end state representing a state of a front end of the carrier tape being one of: the base tape and cover tape are both present. the cover tape is peeled from the base tape, and only the cover tape is present; and a control device configured to determine the cutting portion of each of the base tape and the cover tape based on the tape front end state acquired from the state detection device and according to a type of the tape feeder and control operations of the feeding device and the cutting device so that the base tape and the cover tape are cut at each determined cutting portion.

2. The automatic tape processing device according to claim 1, wherein the control device determines the cutting portion according to an actual tape front end state representing the tape front end state detected by the state detection device based on a target tape front end state representing the tape front end state set in advance for each type of the tape feeder.

3. The automatic tape processing device according to claim 1, wherein the tape front end state is a peeled state where the cover tape is peeled from the base tape, and the peeled state includes a peeled length of the cover tape peeled from the base tape and a surplus length of the cover tape peeled from the base tape and surplus from the front end of the base tape.

4. The automatic tape processing device according to claim 1, wherein the tape front end state is a peeled state where the cover tape is peeled from the base tape, and the tape front end state includes a number of empty cavities that do not accommodate the component from the front end of the carrier tape.

5. The automatic tape processing device according to claim 1, wherein the control device causes the feeding device to subsequently position the cutting portions of the base tape and the cover tape at predetermined cutting positions.

6. The automatic tape processing device according to claim 1, further comprising:

a determination device configured to determine the type of the tape feeder, wherein the control device acquires a determination result by the determination device.

7. The automatic tape processing device according to claim 6, wherein the determination device determines the type of the tape feeder based on identification information for identifying the tape feeder or image information for identifying the tape feeder.

8. The automatic tape processing device according to claim 1, further comprising:

a component presence/absence detection device configured to detect presence/absence of the component in the cavity of the carrier tape, wherein the control device determines the cutting portion of each of the base tape and the cover tape by using a distance from a front end of the base tape to the cavity accommodating a leading component, which is set in advance for each type of the tape feeder, based on a component detection signal acquired from component presence/absence detection device when the carrier tape is fed and moved, the component detection signal indicating transfer from the cavity in which the component is not accommodated to the cavity in which the component is accommodated.

9. A reel loading device for loading a tape reel into the tape feeder by transferring the tape reel around which the carrier tape processed by the automatic tape processing device according to claim 1 is wound to the corresponding tape feeder and conveying the carrier tape to a component supply position provided in the tape feeder.

10. An automatic tape processing device comprising:

a feeding device in which a cover tape is adhered to an upper surface side of a base tape in which cavities configured to accommodate a component are provided at a constant pitch, the feeding device being configured to convey a carrier tape to be loaded into a tape feeder;

a cutting device configured to cut each of the base tape and the cover tape at a cutting portion;

a forming device configured to form front end shapes of the base tape and the cover tape cut by the cutting device at the cutting portion; and a control device configured to determine the cutting portion of each of the base tape and the cover tape according to a type of the tape feeder and control operations of the feeding device and the cutting device so that the base tape and the cover tape are cut at each determined cutting portion, wherein the control device causes the forming device to form the front end shape after the cutting device cuts the base tape and the cover tape.

11. The automatic tape processing device according to claim 10, wherein the control device forms the front end shape according to the type of the tape feeder.

* * * * *